United States Patent [19]
Payne et al.

[11] 3,808,399
[45] Apr. 30, 1974

[54] THERMAL DISPLAY SYSTEM

[75] Inventors: Thomas R. Payne; Hubert R. Plumlee, both of Plano; Millard M. Judy, Dallas, all of Tex.

[73] Assignee: Texas Instruments Incorporated, Dallas, Tex.

[22] Filed: June 25, 1971

[21] Appl. No.: 156,772

[52] U.S. Cl. .................................. 219/216, 219/543
[51] Int. Cl. ................................................ H05b 3/02
[58] Field of Search ..................... 219/216, 538, 543; 317/101 A, 101 CC; 161/185, 193

[56] References Cited

UNITED STATES PATENTS

| | | | |
|---|---|---|---|
| 3,496,333 | 2/1970 | Alexander et al. | 219/216 |
| 3,546,064 | 12/1970 | Hamilton | 161/185 |

OTHER PUBLICATIONS

L. F. Miller, IBM Technical Disclosure Bulletin, "Microelectronic Device Standoffs," Vol. 8, No. 3, 8/65, p. 380.

*Primary Examiner*—C. L. Albritton
*Attorney, Agent, or Firm*—Harold Levine; Edward J. Connors, Jr.; Andrew M. Hassell

[57] ABSTRACT

A thermal display system is described which comprises an array of semiconductor heater elements bonded to a ceramic substrate by a layer of epoxy of predetermined thickness. The thickness of the epoxy may be controlled by spacer means disposed in the epoxy between the silicon slice and the substrate. The spacer means may be particles of predetermined maximum size dispersed in the epoxy, may be protrusions from the ceramic substrate, or may be protrusions from the silicon slice. Methods are also described for fabricating each of the displays, including methods for controlling the thickness other than by the use of spacers.

14 Claims, 15 Drawing Figures

THERMAL DISPLAY SYSTEM

This invention relates generally to thermal displays, and more particularly relates to an improved thermal print head used to form characters on a sheet of thermally sensitive paper.

Thermal printers have heretofore been manufactured and used which comprise an array of semiconductor mesas, typically four-by-five or five-by-seven arrays. Each semiconductor mesa includes a heating element which can be selectively energized. The heating element is typically a transistor diffused into the underside of the mesa, but may comprise other types of heating elements. The collector of each transistor includes a resistance of approximately 100 ohms. When the transistor is turned on, current flows through the collector resistor which dissipates power in the form of heat. If a heat sensitive paper is in contact with an energized mesa, the heat from the mesa activates a chemical process which causes a color change in the paper. The effect of energizing selected mesas of the array is to produce a character on the paper.

The fundamental task in thermal printers of this type is to transfer an adequate amount of heat to the paper in the correct areas at the correct time. Too little heat transferred from the energized mesas to the paper results in dim characters or no characters at all. Too much heat generated in the mesas causes heating of adjacent non-energized mesas, which may cause bleeding or blurring of the character or may even falsely turn the adjacent mesa on. It is also necessary for the mesas to be quickly heated and cooled in order to have a sufficiently short print cycle, which is typically about ten milliseconds. The thermal print heads fabricated using previous methods have always drastically varied in performance between the two extreme conditions of performance mentioned above. This has resulted in such low yield as to make the manufacture of the devices marginally economical at best.

We have discovered that the solution to these problems lies in the control of the heat transfer characteristics of the relatively thin layer of epoxy bonding the silicon material to the ceramic substrate. Workers in the art have heretofore presumed that the epoxy, which was used merely as an adhesive, had no significant bearing upon the operation of the device because of its relative thinness. As a result, the epoxy had heretofore been applied manually using a brush and stencil. This resulted in great variations in the thickness of the epoxy from unit to unit, and even resulted in variations in thickness across a given unit. The potential for error was compounded by the fact that each silicon slice was manually placed on the uncured epoxy with uncontrolled force.

This invention is concerned with an improved thermal printer in which a heater element array member is bonded to a heat sink member by a layer of adhesive material having a predetermined thermal conductivity selected to provide a print cycle of minimum duration during which a selected mesa is heated to a predetermined temperature and then cooled below a print threshold temperature. The thermal conductivity is controlled by providing an adhesive layer having a predetermined bulk thermal conductivity and a predetermined thickness between the heat sink and the heater elements. In a preferred embodiment of the invention, spacer means is provided between the heat sink and the heater elements to provide the predetermined thickness. More specifically, the spacer means provides at least three contact points not in a straight line. The spacer means may comprise particles dispersed within the adhesive, or protrusions formed either upon the heat sink or upon the heater structure.

In accordance with one embodiment of the method of the present invention, a predetermined quantity of adhesive is placed on one of the members in a predetermined area. The other of the members is then mated with the adhesive in a manner to assure a layer of adhesive of predetermined thickness after cure. The manner of determining the predetermined thickness may comprise physically moving the members to measured relative positions. An alternative method entails applying a predetermined force pressing the members against the measured quantity and area of the adhesive.

In accordance with another embodiment of the method of the present invention, particles of predetermined maximum size are dispersed in the adhesive prior to application between the members, the members are pressed against the opposite sides of the maximum sized particles. When the adhesive is an epoxy, the force pulling the two members together may be the shrinkage forces of the epoxy.

The novel features believed characteristic of this invention are set forth in the appended claims. The invention itself, however, as well as other objects and advantages thereof, may best be understood by reference to the following detailed description of illustrative embodiments when read in conjunction with the accompanying drawings, wherein:

Figures 4, 5, 6, 7, 8, 9:
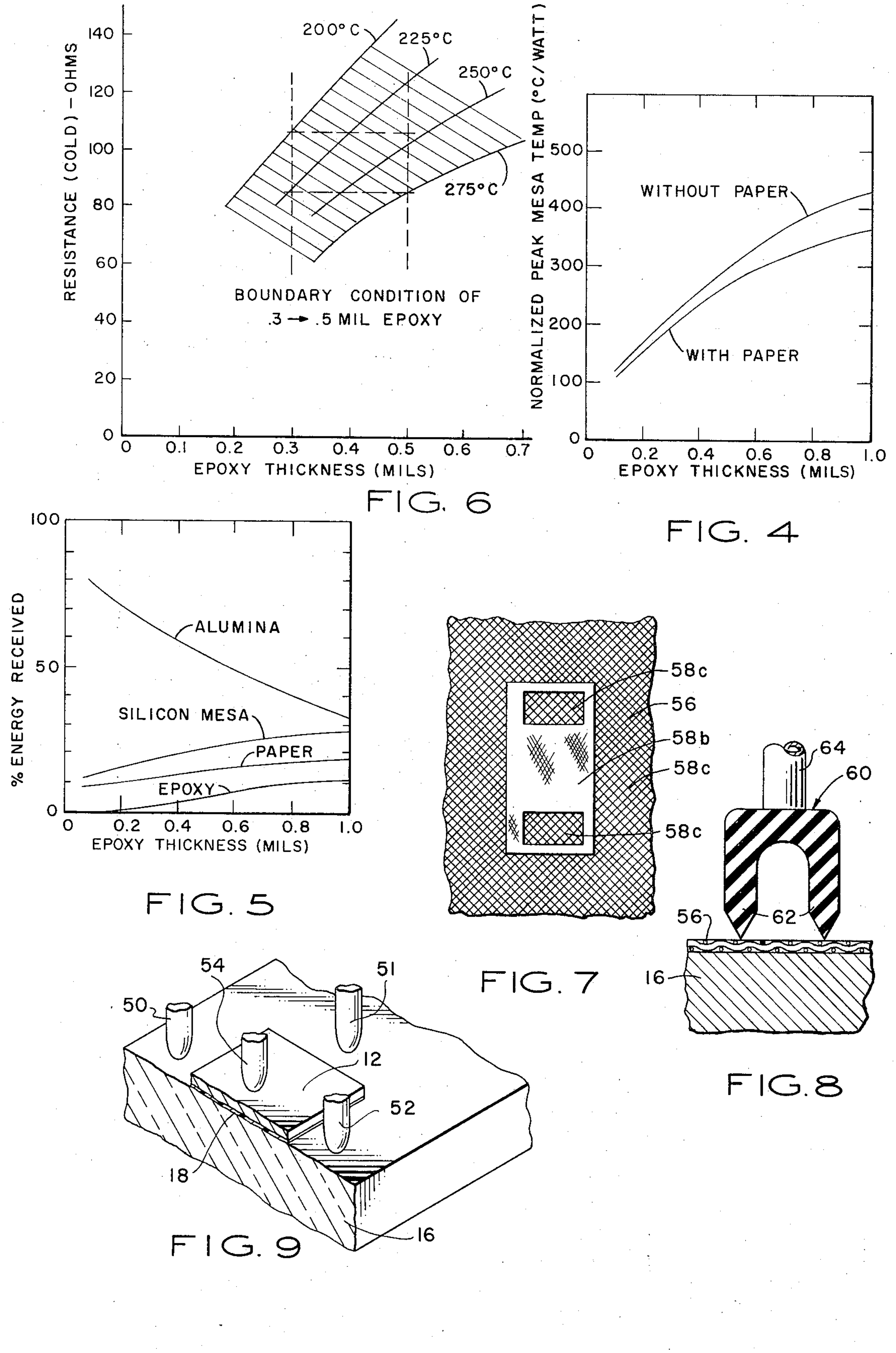
FIGS. 4, 5 and 6 are graphs which serve to illustrate the effect of variations in the thickness of the epoxy on operational perimeters of a typical thermal printer.
FIG. 7 is a schematic illustration of a wire screen used in an embodiment of the method of the present invention.
FIG. 8 is a schematic sectional view of an applicator used with the screen of FIG. 7.
Figure 11:
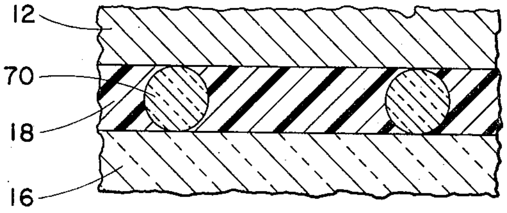
Figure 13:
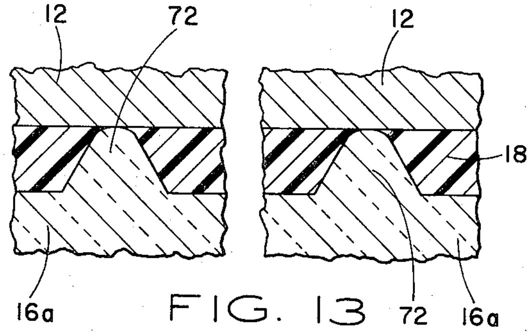
Figure 12:
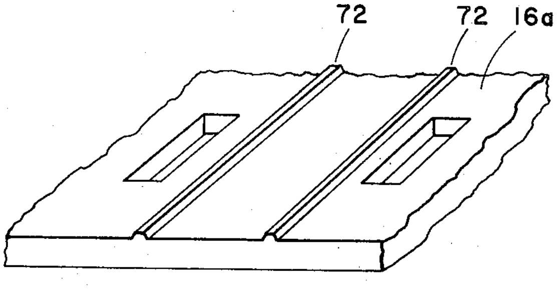
Figure 14:
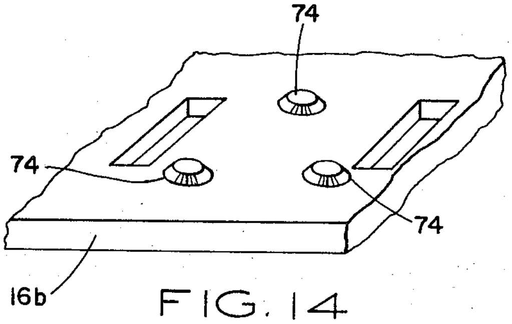
Figure 10:
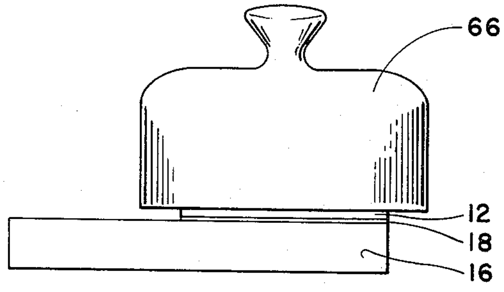
Figure 15:
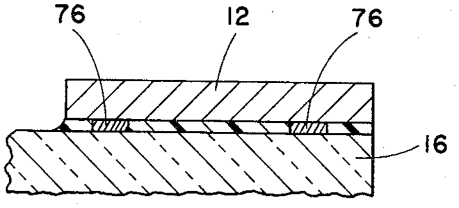

FIG. 9 schematically illustrates apparatus used in carrying out an alternative method of the present invention;

FIG. 10 schematically illustrates apparatus used in carrying out an alternative method of the present invention;

FIG. 11 is an enlarged sectional view illustrating the method and device in accordance with the present invention;

FIG. 12 is an isometric view of a ceramic substrate fabricated in accordance with the present invention;

FIG. 13 is a sectional view of a device in accordance with the present invention which utilizes the substrate of FIG. 12;

FIG. 14 is an isometric view of an alternative embodiment of the substrate for a device in accordance with the present invention; and, FIG. 15 is a simplified schematic sectional view of a portion of still another embodiment of apparatus in accordance with the present invention.

Figure 1:
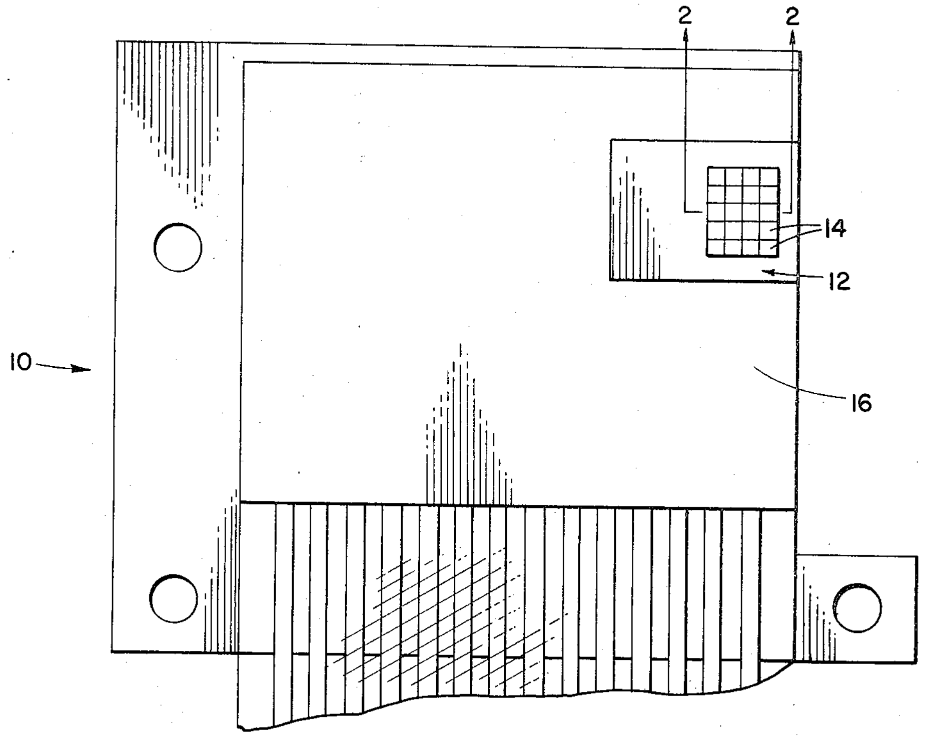
FIG. 1 is a top view of a thermal printer in accordance with the present invention.
Figure 3:
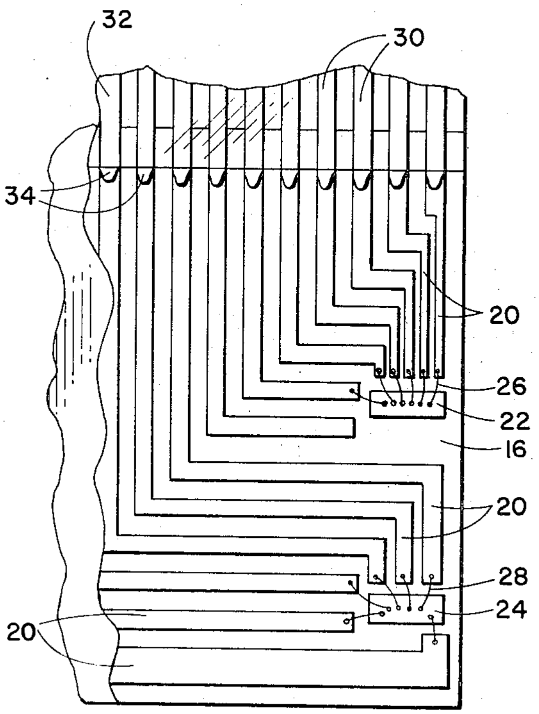
FIG. 3 is a view of the bottom of the ceramic substrate of the thermal printer of FIG. 1.
Figure 2:
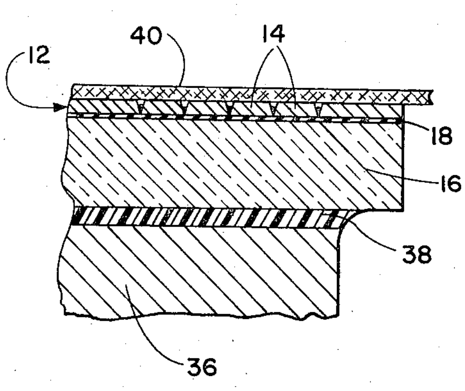
FIG. 2 is a sectional view taken substantially on lines 2—2 of FIG. 1.

Referring now to the drawings, and in particular to FIG. 1, a thermal printer in accordance with the present invention is indicated generally by the reference numeral 10. The printer 10 is comprised of an array member 12 having a four-by-five array of thermal print elements 14. The array member 12 is bonded by a layer of an adhesive 18 to a substrate 16 which may be made from alumina, other ceramic material, or any other material having the desired mechanical stability, thermal conductivity and capacity, and electrical resistivity. The array member 12 is preferably of the type described in copending U.S. patent application entitled "THERMAL DISPLAY DEVICE", (TI-4507) Ser. No. 156,756 filed June 5, 1971 by Thomas R. Payne et al., and assigned to the assignee of the present invention. That application discloses an array member 12 wherein the thermal print elements 14 are monocrystalline silicon mesas which are interconnected by a grid of polycrystalline silicon material and layers of silicon dioxide into a monolithic slice about 1.5 mils thick. However, in accordance with broader aspects of the present invention, the elements 14 of the printer may each be discrete mesas interconnected only by the substrate 16. However, in the latter case, the heater elements 14 are held in a predetermined relationship one to the other and to the remainder of the member 12 by a structure which is substantially removed after the elements 14 are bonded to the substrate 16 by the adhesive 18. The bottom of the substrate 16 is illustrated in FIG. 3 and has a plurality of metal leads 20, typically twelve, which terminate adjacent openings 22 and 24. Metalized electrical conductors on the bottom of the heater member 12 terminate at pads which are positioned over the openings 22 and 24, and small wires 26 and 28 are ball-bonded to the conductors on the back of the semiconductor member 12 and to the printed circuit conductor strips 20. The conductors 20 are then connected to conductors 30 on a flexible strip 32 by solder connections 34. The substrate 16 is then bonded to a metal heat sink 36 by a relatively thick layer 38 of another epoxy adhesive.

In order to appreciate the size of the print head 10, each of the elements 14 of the array member are typically about 14 by 15 mils. The elements 14 and the remainder of the array member 12 are typically about 1.5 mils thick. The ceramic substrate 16 is typically from 15 to 20 mils thick, the adhesive layer 38 about 10 mils thick, and the metal heat sink 36 of any thickness desired, typically several times the thickness of the ceramic substrate 16.

In accordance with this invention, the thermal conductivity of the adhesive layer 18 is closely controlled. Such control is primarily dependent upon controlling the thickness of the adhesive, since the composition of the adhesive can be relatively easily controlled. The adhesive 18 is preferably a thermal setting epoxy but can be other types of adhesive. The epoxy should be electrically insulating and must be able to withstand temperatures of several hundred degrees centigrade without deterioration. Of course, the epoxy must provide a strong rigid bond. We have found that a preferred adhesive is an epoxy such as that manufactured by Ren Adhesive Company and identified as REN RESIN which is mixed with REN HARDNER. For optimum results, the current embodiment of device 10 having the typical dimensions mentioned should have a layer 18 of epoxy having a thickness about 0.5 mils.

In the operation of the device 10, selected mesas 14 are energized to produce an alpha-numeric character.

The energized elements 14 receive current through a resistance which heats the individual elements. A sheet of thermally sensitive paper 40 disposed adjacent the elements 14 is heated in a localized area to produce a discoloration. After the elements 14 have been deenergized, the elements must cool before the paper is indexed to a new position relative to the device 10 and the print cycle repeated.

The fundamental problem is transferring an adequate amount of heat to the paper at the correct time. Too little heat produces a no print condition, and too much heat causes thermal bleeding and a smearing of the character. If an element 14 does not cool down quickly enough after being deenergized, the element will continue to print during the next print cycle. Since the paper is a very poor conductor, the mesa would cool off very slowly if the paper were the only heat sink. The ceramic 16 is employed to provide a short term heat sink for cooling the energized elements 14 after each cycle. However, if the amount of heat transferred to the substrate 16 is too great, then insufficient heat is transferred to the paper to obtain the desired color change in the paper. The total amount of heat generated cannot be increased because of limitations on the amount of power which can be dissipated within the system. Thus, in order to achieve adequate mesa heating, but sufficient cooling after printing, the amount of heat which is transferred from the elements 14 to the heat sinking substrate 16 must be controlled with considerable precision.

The transfer of heat from the elements 14 to the substrate 16 is dependent primarily upon the thickness of the adhesive layer 18. The thick adhesive layer 38 connecting the heat sinking substrate 16 to the primary heat sink 36 is not particularly critical because the heat transfer is long term dependent. FIG. 4 represents the theoretical normalized peak mesa temperature, expressed in degrees centigrade per watt of energy dissipated, with respect to the thickness of an epoxy layer 18. It will be noted that variations in the thickness of an epoxy layer from 0.2 mils to 0.8 mils results in a variation in peak temperature from about 170°C to about 400°C, for a system having the approximate dimensions heretofore described. The curves of FIG. 5 illustrate, from top to bottom, the percent of energy for an alumina substrate 16, a silicon mesa 14, the paper 40, and an epoxy layer 18.

The curves of FIG. 6 illustrate the peak mesa temperatures which are produced by various epoxy thicknesses, for a given resistance, in ohms, of the heater elements 14, using a supply voltage of 13.5V, where the resistance is the collector resistance of a transistor diffused into a silicon mesa. The significance of FIG. 6 is that the two variables most difficult to control during the fabrication of an array member 12 are the heater resistance and the thickness of the epoxy layer. Thus, if the thickness of the epoxy can be maintained between 0.3 and 0.5 mils in thickness, and the resistance can be maintained between about 90 and about 110 ohms, then the maximum range of peak mesa temperatures will be within the range from about 200°C to about 275°C. Temperatures within this range produce acceptable print capabilities.

The thickness of the adhesive layer 18 may be controlled with the desired precision using the method illustrated in FIG. 9. A quantity of epoxy is applied to the substrate 16 within a confined area using a suitable stencil. The thickness of the epoxy when first applied is not particularly critical, so long as an adequate supply is present. However, the epoxy should have a consistent thickness in the uncured state. The thickness of the array member 12 is measured by some suitable means, such as by calipers. At this time, the array member 12 will usually be substantially thicker than the final thickness of the elements 14, as described in the above referenced copending application. The member 12 is then placed on the uncured epoxy 18 and is pressed downwardly using a micrometer type instrument having three probes 50, 51 and 52 disposed in a plane. The point of the center probe 54 is positioned above the plane of the probes 50, 51 and 52 by a distance equal to the measured thickness of the array member 12, plus the desired thickness of the epoxy 18, allowing for shrinkage during curing of the epoxy. The center probe 54 is then pressed against the array member 12 at several points until the outer probes engage the substrate 16 as illustrated in FIG. 9. This presses the array member 12 to a predetermined position relative to the substrates 16 before the epoxy is cured so that the layer of epoxy 18 will be the desired thickness after the epoxy is cured. If an epoxy of properly controlled thixotropic characteristics is used, the substrate 16 may then be inverted so that the weight of the member 12 places the epoxy 18 in tension and the assembly placed in a curing oven for the desired time. By standardizing the curing procedure, the resulting thickness of the cured layer of epoxy layer 18 will have the desired thickness within certain tolerances.

One method for controlling the thickness of the adhesive layer 18 is to apply a controlled thickness of epoxy to the substrate 16, then control the force pressing the array element 18 and substrate 16 together. A measured quantity of epoxy may be applied to a predetermined area of the ceramic substrate 16 by the apparatus illustrated in FIGS. 7 and 8. A screen 56 shown in FIG. 7 is positioned over the substrate 16 as illustrated in FIG. 8. The screen 56 has an opaque portion **56*a* as a result of being impregnated with a polymerized plastic, and an open mesh area 58*b* which corresponds roughly to the shape of the member 12. Within the open mesh area 58*b* are opaque sections 58*c* which are positioned to cover the apertures 22 and 24 of the substrate 16. The screen 56 may be formed from stainless steel wire having a diameter of 0.0012 inches and a 270 mesh. Other diameter wire and mesh can be used to produce more or less epoxy thickness as required. An applicator 60 is then used to apply the epoxy through the screen 58. The epoxy is fed to the channel between the points 62 by way of a conduit 64. By standardizing the manner in which the applicator 60 is filled and manipulated across the screen 56,** the quantity of the epoxy can be controlled within certain tolerances.

After a predetermined quantity of the epoxy has been placed within the confined area as described in connection with FIGS. 7 and 8, the member 12 is placed on the epoxy and a weight 66 placed on the member 12. The weight 66 should be sufficient to be greater than any force that would be placed upon the member 12 as it is manually positioned on the layer of uncured epoxy. The stack illustrated in FIG. 10 is then placed in a curing oven at a predetermined temperature for a predetermined period of time. The resulting layer 18 of epoxy will have a predetermined thickness within certain tolerances.

The preferred method for controlling the thickness of the epoxy layer in accordance with this invention is illustrated in FIG. 11. In this method, a relatively large number of particles 70 are dispersed throughout the epoxy 18 before it is applied by the applicator 60 through the screen 56. The particles 70 may be glass spheres, or may be angularly shaped particles. In either event, the maximum dimensions of the particles correspond to the final thickness desired for the epoxy layer 18. For example, glass beads having a maximum diameter of 0.4 mils will result in a final layer of epoxy 18 having a thickness of 0.4 mils. The smaller particles do not effect the spacing. About 0.05 grams of spherical glass balls ranging in size from 0.3 to 0.4 mils in diameter mixed with 10 cc's of epoxy produces the desired results. Other percentages can be used up to several percent of beads by weight. This quantity of glass beads does not materially change the thermal conductivity of the epoxy layer 18. However, if it is desired to alter the conductivity of the layer 18, a greater number of the particles 70, or of any other filler material having suitable thermal characteristics may be added to the epoxy 18.

An alternative form of spacer means is illustrated in FIG. 12 and comprises a pair of ridges 72 formed on the substrate **16*a*. It will be noted that the ridges 72 are positioned on either side of the array of elements 14 so as not to affect the transfer of heat from the elements to the substrate. The ridges 72 may be formed at the time ceramic substrate 16*a* is molded, or may be formed by milling. The epoxy may again be placed on the ceramic substrate 16*a* using a stencil or any suitable application means, since the thickness of the uncured epoxy is not significant. Then the array member 12 is pressed downwardly against the protrusions 72 to the position illustrated in FIG. 13. Even though the protrusions 72 are disposed along the edges of the array of elements 14, the protrusions will still be effective in spacing the elements 14 a predetermined distance from the substrate 16 as the epoxy layer 18 is cured, because it will be recalled that the array member 12 is a monolithic structure at this point in the fabrication process. This is true even in structures where the heater elements 14 are substantially separated into individual elements 14 by etching after all are securely bonded to the substrate 16a** by cured epoxy.

Still another form of spacer means is illustrated in FIG. 14 and comprises three frusto-conically shaped protrusions 74 formed on the ceramic substrate **16*b*. The protrusions 74 are spaced in a triangle at the edges of the array 14 so as not to materially effect heat transfer from the elements 14 to the substrate 16. The protrusions 74 are preferably formed integrally with the ceramic substrate 16*b*. However, the protrusions 74 may be formed by vapor depositing a metallic film on the ceramic substrate 16*b* to a predetermined thickness, and then removing the metalized film in unwanted areas using conventional photo-resist and etching processes. Application of the epoxy 18 and the member 12 to the substrate 16*b* is exactly as heretofore described in connection with the FIGS. 12 and 13.**

Still another type of spacer means in accordance with the present invention is illustrated in FIG. 15. In FIG. 15, protrusions 76 are formed on the bottom face of the array member 12. The protrusions 76 have a predetermined thickness and may comprise metallized films deposited on the face of the silicon slice, or upon an oxide layer formed on the silicon slice. The protrusions 76 may take on any configuration desired, but are preferably disposed in positions other than under the heater elements 14. The metallized films 76 may be formed using conventional techniques for producing beam leads, for example, and in fact may comprise beam leads spaced around the periphery of the member 12 for connection to conductors (not illustrated) deposited on the upper surface of the substrate 16.

From the above description of preferred embodiments of the invention, it will be appreciated that method and apparatus have been described for producing improved thermal printers. The thermal printer is assured of having a uniform print intensity across the matrix of heater elements. THe printer is also assured of printing characters of uniform intensity. The methods of the present invention materially increase yields and thus significantly reduce the cost of manufacture.

Although preferred embodiments of the invention have been described in detail, it is to be understood that various changes, substitutions and alterations can be made therein without departing from the spirit and scope of the invention as defined by the appended claims.

What is claimed is:

1. The thermal display system which comprises:

an array member having an array of selectively energizible heater elements;

a substrate for acting as a heat sink; and a layer of adhesive material having a predetermined uniform thickness and a preselected thermal conductivity for bonding the array member to the substrate, said thickness selected in a controlled relationship to said conductivity to provide a preselected uniform thermal impedence through said layer for controlling the rate of heat transfer to said member.

2. A thermal display system comprising:

a. an array member having an array of selectively energizible heater elements;

b. a substrate for acting as a heat sink;

c. a layer of adhesive material having a predetermined uniform thickness and a preselected thermal conductivity for bonding the array member to the substrate, said thickness selected in a controlled relationship to said conductivity to provide a preselected uniform thermal impedence through said layer for controlling the rate of heat transfer to said member; and d. spacer means disposed between said array member and said substrate for effecting said predetermined thickness in controlled relationship to said conductivity.

3. The thermal display system of claim 2 wherein the spacer means comprises particles dispersed in the adhesive.

4. The thermal display system of claim 3 wherein the adhesive is an epoxy and the particles are glass spheres.

5. The thermal display system of claim 2 wherein the spacer means comprises protrusions from the substrate.

6. The thermal display system comprising:

a. an array member having an array of selectively energizable heater elements;

b. a substrate providing a heat sink;

c. a layer of adhesive material bonding the array member to the substrate; and d. spacer means disposed between the array member and the substrate for positioning the array member and substrate in predetermined spaced relationship comprising protrusions from the substrate.

7. The thermal display system of claim 6 wherein the heater elements occupy only a portion of the array member and the protrusions are disposed around the array of heater elements.

8. The thermal display system of claim 7 wherein the spacer means comprises at least two elongated, protruding spaced ridges formed on the surface of the substrate.

9. The thermal display system of claim 7 wherein the spacer means comprises at least three protrusions from the surface of the substrate not in a straight line.

10. The thermal display system of claim 2 wherein the spacer means comprises protrusions from the array member.

11. The thermal display system of claim 7 wherein the array of heater elements occupy only a portion of the array member and the spacer means are spaced around the heater elements.

12. The thermal display system comprising:

a. an array member having an array of selectively energizable heater elements;

b. a substrate providing a heat sink;

c. a layer of adhesive material bonding the array member to the substrate; and d. spacer means disposed between the array member and the substrate for positioning the array member and substrate in predetermined spaced relationship comprising protrusions from the array member.

13. The thermal display system of claim 12 wherein the spacer means comprises layers of metal deposited on the array member.

14. The thermal display system of claim 13 wherein at least a portion of the layers of metal also form electrical conductors to at least a portion of the heater elements.

* * * * *